(12) United States Patent
Ono

(10) Patent No.: US 6,506,290 B1
(45) Date of Patent: Jan. 14, 2003

(54) SPUTTERING APPARATUS WITH MAGNETRON DEVICE

(75) Inventor: Masanori Ono, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/830,629
(22) PCT Filed: Oct. 29, 1999
(86) PCT No.: PCT/JP99/06042
§ 371 (c)(1), (2), (4) Date: Apr. 30, 2001
(87) PCT Pub. No.: WO00/26430
PCT Pub. Date: May 11, 2000

(30) Foreign Application Priority Data

Oct. 30, 1998 (JP) .......................................... 10-310633

(51) Int. Cl.⁷ .............................................. C23C 14/34
(52) U.S. Cl. ............................. 204/298.11; 204/298.12; 204/298.19; 204/298.26
(58) Field of Search ....................... 204/298.12, 298.19, 204/298.2, 298.26, 298.11

(56) References Cited

U.S. PATENT DOCUMENTS

| | | | | |
|---|---|---|---|---|
| 4,761,218 A | * | 8/1988 | Boys ........................ | 204/192.2 |
| 5,174,875 A | * | 12/1992 | Hurwitt et al. ......... | 204/192.12 |
| 5,738,767 A | * | 4/1998 | Coad et al. ............. | 204/192.12 |
| 5,744,011 A | * | 4/1998 | Okubo et al. ........... | 204/192.12 |
| 5,865,961 A | * | 2/1999 | Yokoyama et al. .... | 204/192.12 |
| 6,132,563 A | * | 10/2000 | Frach et al. ............. | 204/192.13 |
| 6,197,165 B1 | * | 3/2001 | Drewery et al. ........ | 204/192.12 |

FOREIGN PATENT DOCUMENTS

| | | | |
|---|---|---|---|
| JP | 61-284571 | 12/1986 | |
| JP | 62-75063 | 5/1987 | |
| JP | 62-250174 | 10/1987 | |
| JP | 63270462 A | * 11/1988 | ........... C23C/14/36 |
| JP | 2-225662 | 9/1990 | |
| JP | 8-176817 | 7/1996 | |
| WO | WO 96/26533 | * 8/1996 | |

* cited by examiner

Primary Examiner—Patrick Ryan
Assistant Examiner—Gregg Cantelmo
(74) Attorney, Agent, or Firm—Moser, Patterson & Sheridan, LLP.

(57) ABSTRACT

A sputtering apparatus is provided with a plurality of ring-like targets arranged on a concentric basis in upper part of a process chamber. A pedestal for holding a semiconductor substrate is placed inside the process chamber and a dc power supply is connected to the targets and to the pedestal. Further, the process chamber is connected to a vacuum pump for evacuating the inside thereof and a gas supply for introducing a process gas for generation of plasma, normally argon gas, into the inside of the process chamber. Sputtering yields of the targets can be adjusted by separately controlling potentials of the respective targets. This permits the apparatus to improve uniformity of deposition.

9 Claims, 9 Drawing Sheets

SPUTTERING APPARATUS WITH MAGNETRON DEVICE

This application claims priority under 35 U.S.C. § 119(a) from PCT International Application No. PCT/JP99/06042 filed on Oct. 29, 1999, which in turn claims priority from Japanese Application P1998-310633 filed Oct. 30, 1998.

TECHNICAL FIELD

The present invention relates to sputtering apparatus used in fabrication of semiconductor devices and the like.

BACKGROUND ART

The sputtering apparatus is such apparatus that the surface of a target being a cathode is bombarded with positive ions of a process gas, normally argon ions, in plasma and that target atoms sputtered therefrom are deposited on a substrate on the anode side, for example, on a semiconductor wafer to form a film thereon.

Such sputtering apparatus commonly employs the so-called magnetron method in order to increase sputter efficiency by increasing the plasma density near the surface of the target. This method uses a magnet device generally called a magnetron system to generate a magnetic field parallel to the surface of the target. Since this magnetic field intersects with the electric field established between the target and the wafer, electrons from the target are captured in the region near the surface of the target, so as to increase the plasma density of that region.

Wiring patterns have been scaled down with recent trend toward higher integration of semiconductor devices and it is becoming difficult to effect efficient deposition in contact holes, via holes, etc. by sputtering. For example, when deposition is implemented over a wafer surface with fine holes in the standard sputtering apparatus, there arises the problem that overhangs are formed at entrances of the holes and degrade the bottom coverage. For this reason, new technology has been developed heretofore, including collimation sputtering, long throw sputtering, and so on.

The collimation sputtering is a technique of placing a plate with many holes called a collimator between the target and the semiconductor wafer and letting the sputtered particles pass through the holes of the collimator so as to provide the inherently non-directional sputtered particles with directivity, thereby mainly depositing only the sputtered particles of the vertical component on the semiconductor wafer.

The long throw sputtering is a method in which the distance between the target and the semiconductor wafer is set considerably longer than that before. In this method, the sputtered particles flying at large angles relative to the semiconductor wafer reach the region outside the semiconductor wafer, so that only the sputtered particles flying in nearly perpendicular directions are deposited on the semiconductor wafer.

The above-stated collimation sputtering and long throw sputtering both are deposition techniques capable of realizing excellent bottom coverage and scale-down of wiring pattern. In the collimation sputtering, however, if the sputtered particles are deposited on the collimator and if the amount of deposition becomes large it can cause plugging and, in turn, lead to degradation of uniformity of deposition and decrease in deposition rate. If a film deposited on the collimator is peeled off, it will be contamination on the semiconductor wafer and be the cause of device failure.

Further, the collimation sputtering has another problem that the collimator is heated to high temperatures by the plasma, so as to affect temperature control of the substrate. In addition, since the sputtered particles have the strong straight traveling property, side coverage can be inadequate in some cases.

On the other hand, in the case of the long throw sputtering, since there exists nothing between the target and the semiconductor wafer, there is no need for such a maintenance work as replacement of the collimator, but it has the problem of extremely poor deposition rates, because the distance between the target and the semiconductor wafer is long. In order to assure the vertical deposition of sputtered particles, the discharge voltage needs to be set as low as possible, so as to avoid the sputtered particles from colliding with gas molecules during flight. For this reason, it was necessary to prepare a dedicated magnetron unit in order to enable stable discharge even in a low pressure state, and this was the cause of need for expensive apparatus. Further, there was another problem that deposition rates were different between in the central part and in the peripheral part of the semiconductor wafer and thus uniformity of film thickness was poor across the entire surface of the semiconductor wafer.

There was also such a tendency that erosion occurred greater in the outside part of the target and this posed the problem that the whole target needed to be replaced even with little erosion in the inside part of the target. Arrangement of magnets in the magnetron unit was adjusted in order to uniformize the erosion, but there were various restrictions on the arrangement of magnets. Therefore, there was the problem of incapability of achieving adequate uniformity of erosion.

The present invention has been accomplished under such circumstances and an object of the invention is to provide sputtering apparatus that permits control of directions of deposit-forming particles moving from the target toward the semiconductor wafer, so as to achieve improvement in uniformity of deposition in the surface of the semiconductor wafer.

DISCLOSURE OF THE INVENTION

In order to accomplish the above object, a sputtering apparatus according to the present invention is a sputtering apparatus for depositing a target material on a substrate placed in a process chamber, which comprises a plurality of targets placed opposite the substrate and on a concentric basis in the process chamber, and a means for adjusting sputtering yields of the respective targets.

According to the present invention, the target is divided into a plurality of targets and the sputtering yields are adjusted, for example, by applying different voltages to the respective divisional targets, whereby erosion of each target can be made uniform.

The target placed in the central part can be of either a disk shape or a ring shape.

Further, the present invention is characterized by placement of a shield ring between the targets. This permits plasma to be confined in the space surrounded by the shield ring, which can enhance independence of control of each target and which can restrain the directions of the target particles, thereby enhancing the uniformity of deposition on the surface of the semiconductor wafer.

When the sputtering apparatus of the present invention is provided with a magnetron device, the sputtering yields can also be adjusted by magnets of the magnetron device associated with the respective targets.

The above and other features and advantages of the present invention will become apparent to those skilled in the art by the following detailed description with reference to the accompanying drawings.

BEST MODE FOR CARRYING OUT THE INVENTION

The embodiments of the sputtering apparatus according to the present invention will be described below with reference to the accompanying drawings.

Figure 1:
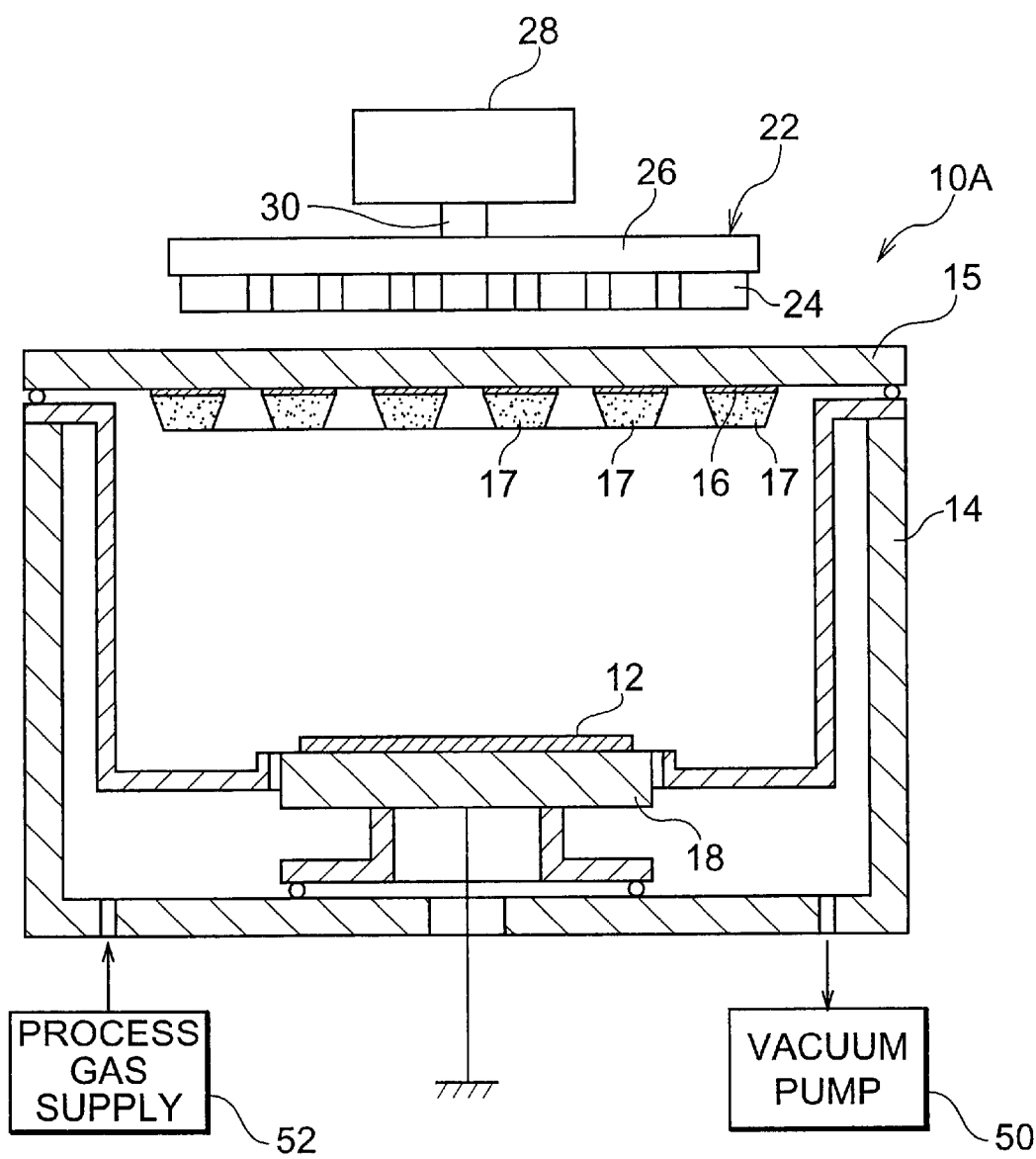
FIG. 1 is a schematic, cross-sectional view to show the first embodiment of the sputtering apparatus according to the present invention.

FIG. 1 is a schematic, cross-sectional view to show an embodiment of the sputtering apparatus according to the present invention. In the figures, the same reference symbols denote like or equivalent portions.

Figure 2:
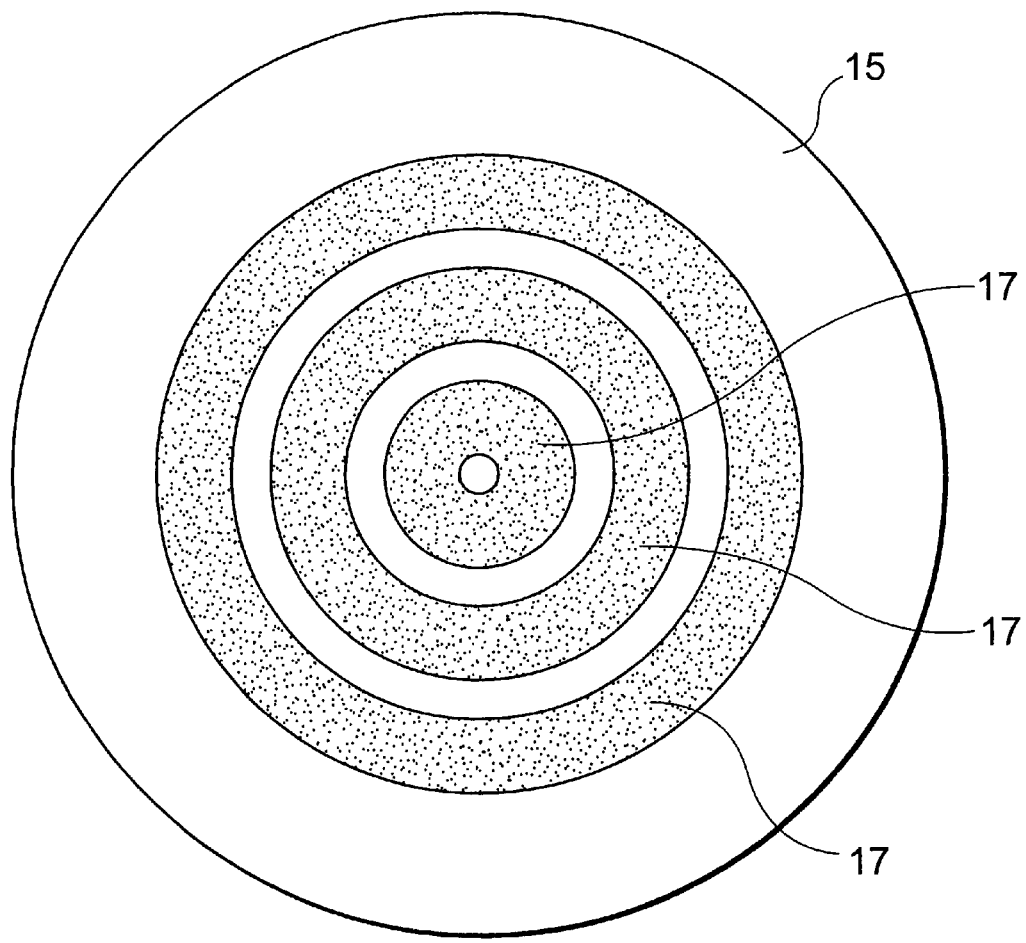
FIG. 2 is a diagram to show the back surfaces of the targets in the sputtering apparatus illustrated in FIG. 1.

In FIG. 1, the sputtering apparatus 10A is provided with a process chamber 14 for carrying out a sputtering process of a substrate 12 such as a semiconductor wafer or the like inside. In the upper part of the process chamber 14, a plurality of targets 17 made of a material to be deposited onto the surface of the substrate 12 are fixed to an electrically insulating support 15 through a back plate 16. The targets 17 have their respective diameters different from each other and are placed on a concentric basis, as illustrated in FIG. 2.

A pedestal (holding means) 18 for holding the substrate 12 is disposed inside the process chamber 14. The upper surface of this pedestal 18 is placed in parallel and opposite to the lower surfaces of the targets 17. The cathode and anode of dc power supply are connected to the targets 17 and to the pedestal 18, respectively, as described hereinafter. Further, a pressure-reducing means for evacuating the inside of the process chamber 14, i.e., a vacuum pump 50 is connected to the process chamber 14, and a gas supply 52 for introducing a process gas for generation of plasma, normally argon gas, into the inside of the process chamber is also connected to the process chamber 14.

In this structure, the argon gas is introduced from the gas supply 52 into the process chamber 14 evacuated to a predetermined pressure by the vacuum pump 50 and a voltage is placed between the targets 17 and the pedestal 18, whereupon plasma is generated inside. Therefore, power supplies $V_1$, $V_2$ described hereinafter function as plasma forming means. At this time, argon ions in the plasma hit the lower surfaces of the targets 17 to sputter atoms of the target material and the target atoms are deposited on the substrate 12 to form a thin film thereon.

A magnetron device 22 is disposed above the support 15 in order to increase the density of the plasma generated in the process chamber 14. This magnetron device 22 is provided with a disklike base god plate 26, which is arranged on the same axis as the targets 17 and to which a plurality of magnet units 24 are fixed, and a driving unit 28 for rotationally driving the base plate 26. A rotational shaft 30 of the driving unit 28 extends so as to be coaxial with the axis of the targets 17 and the base plate 26, and is connected to the center point of the base plate 26. The reason why the base plate 26 is rotated is that it can avoid the problems arising where the magnetic field by the magnet units 24 is stationary to the targets 17.

Figure 3:
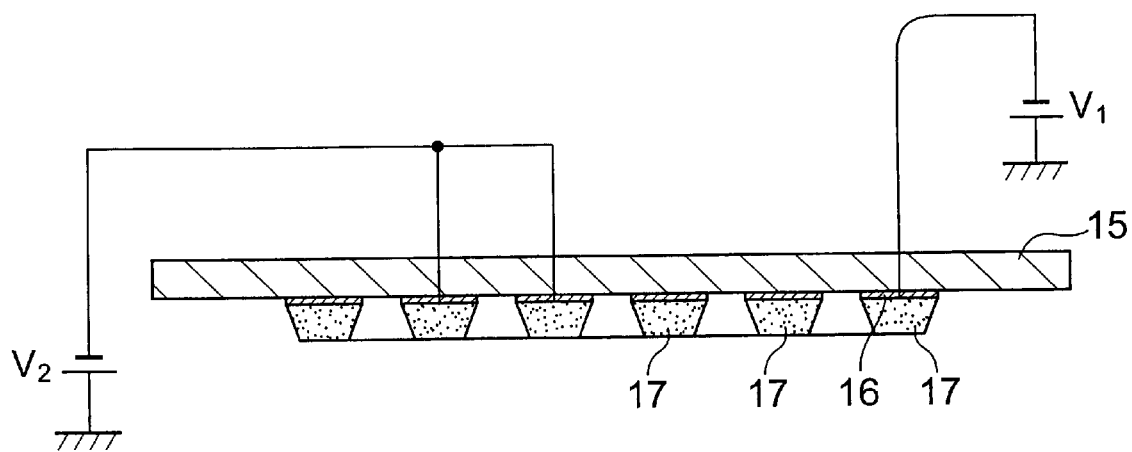
FIG. 3 is a schematic diagram to show an electric wiring system to the targets in the sputtering apparatus illustrated in FIG. 1.

FIG. 3 is a schematic diagram to show the wiring to the plurality of targets 17 placed on a concentric basis. In FIG. 3, a voltage from the dc power supply $V_1$ is applied to the outermost target 17 and the dc power supply $V_2$ is connected to each of the rest targets, i.e., to the middle target and to the innermost target 17. The dc power supply $V_2$ applies a negative voltage higher than the voltage of the dc power supply $V_1$, to the middle and inside targets. This changes distribution of plasma density, so as to weaken the sputtering yield of the outside target 17, thereby enabling erosion to occur uniform. Even if there occurs non-uniform erosion in the targets, the separate ringlike targets 17 will be able to be replaced separately, which can decrease the cost, when compared with replacement of a large target heretofore. It also becomes feasible to place the magnets or magnet units 24 of the magnetron device 22 corresponding to the respective targets 17, which presents the advantage of easy independent control of sputtering yields of the targets 17 by adjusting the arrangement and magnetic force of the magnets.

Figure 4:
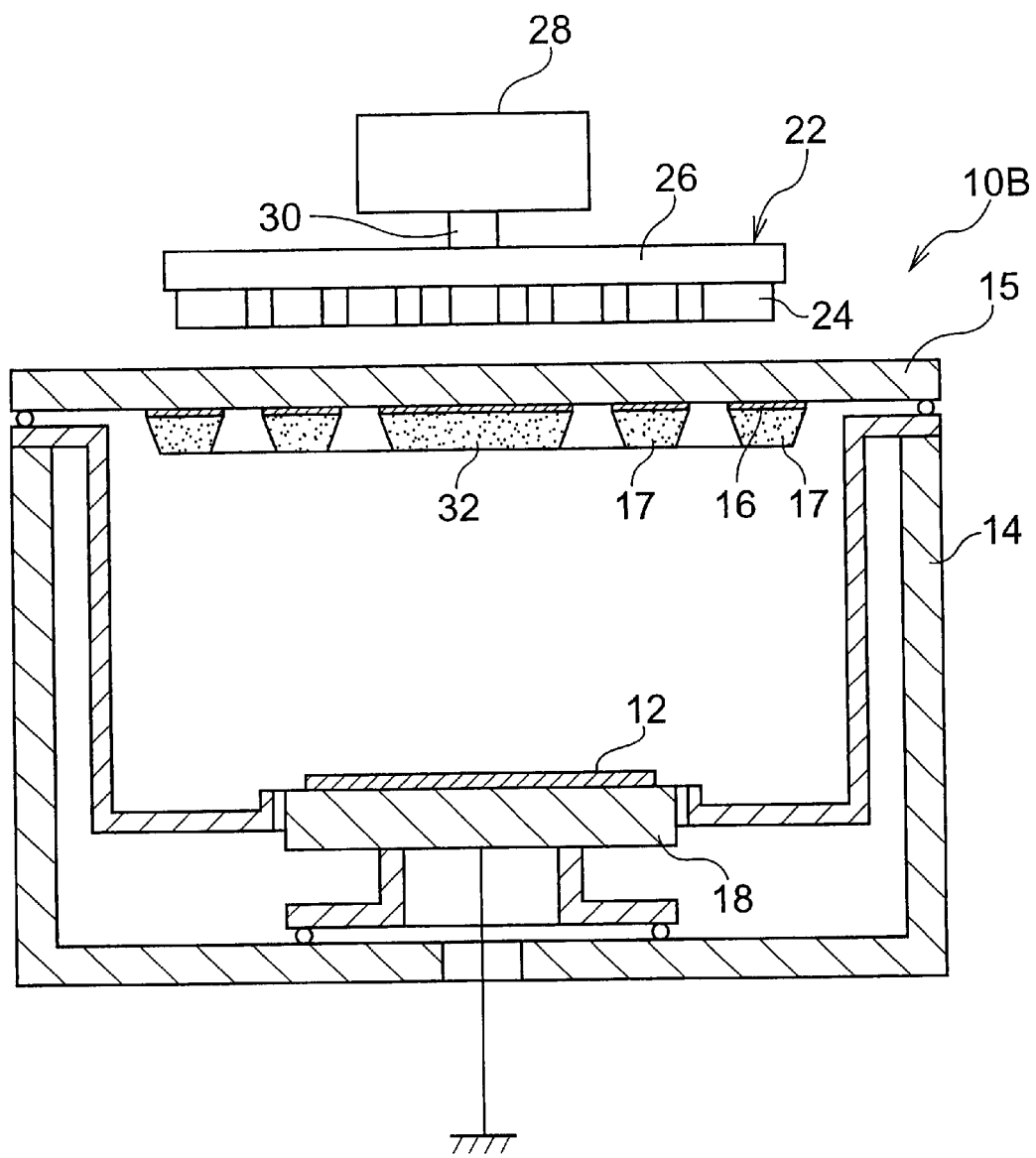
FIG. 4 is a schematic, cross-sectional view to show the second embodiment of the sputtering apparatus according to the present invention.
Figure 5:
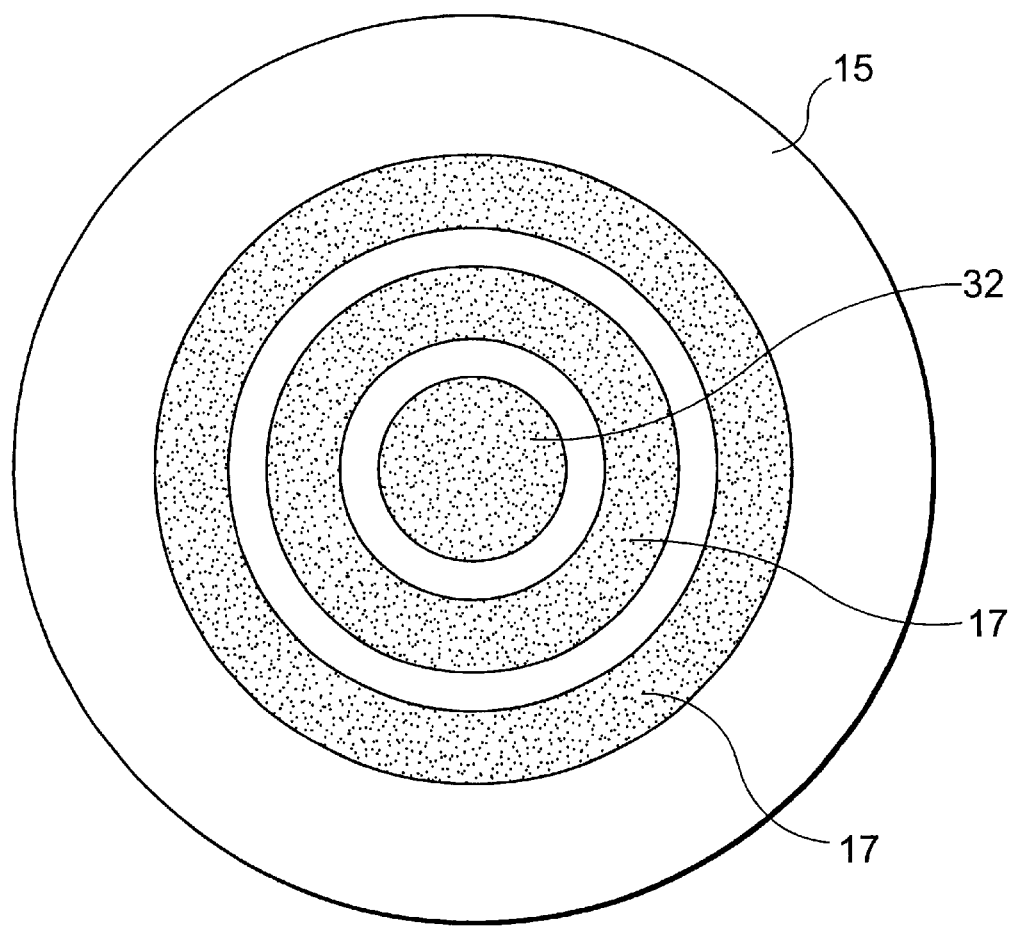
FIG. 5 is a diagram to show the back surfaces of the targets in the sputtering apparatus illustrated in FIG. 4.

FIG. 4 is a schematic, cross-sectional view to show the second embodiment of the sputtering apparatus according to the present invention. In FIG. 4, the sputtering apparatus 10B has the structure basically similar to that of the sputtering apparatus 10A illustrated in FIG. 1, but is different therefrom in that the target in the central part of the support 15 is replaced by a disklike target 32. Namely, the ringlike targets 17 are placed around the center disklike target 32, as illustrated in FIG. 5.

Figure 6:
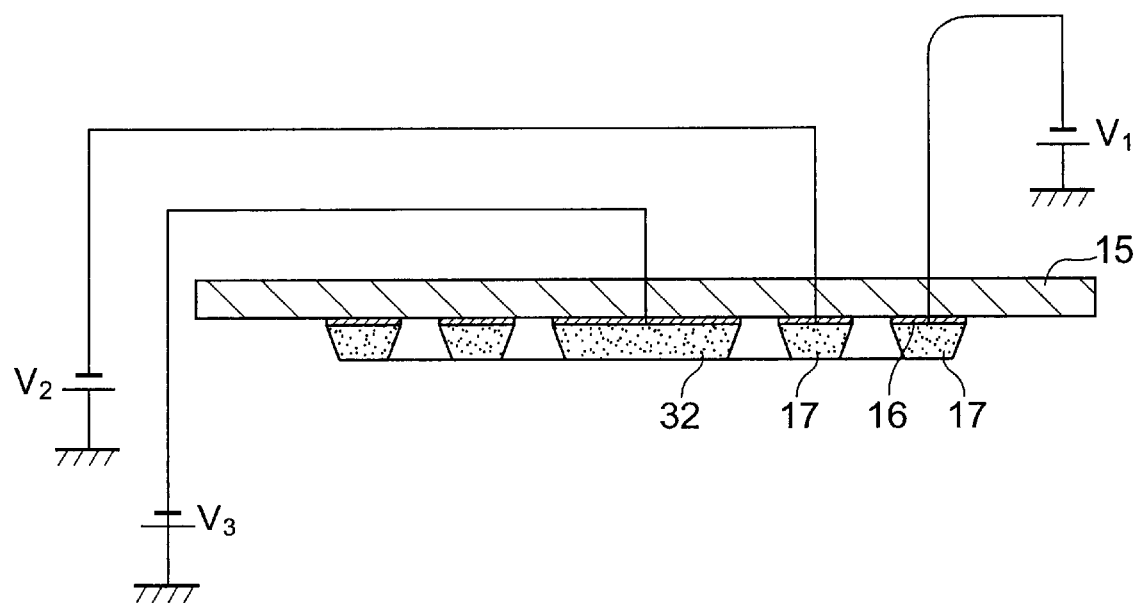
FIG. 6 is a schematic diagram to show an electric wiring system to the targets in the sputtering apparatus illustrated in FIG. 4.

As illustrated in FIG. 6, dc power supplies $V_1$, $V_2$, and $V_3$ are connected to the respective targets 17, 32. The dc power supply $V_1$ can apply a minimum negative voltage and the dc power supply $V_3$ a maximum negative voltage. This can lower the sputtering yield of the outermost target 17, so as to make erosion uniform. Since the disklike target 32 is located in the central part in this embodiment, deposition can be implemented of a sufficient amount of the target material. Further, even if there occurs non-uniform erosion in the targets, the separate ringlike targets 17 will be able to be replaced separately.

Figure 7:
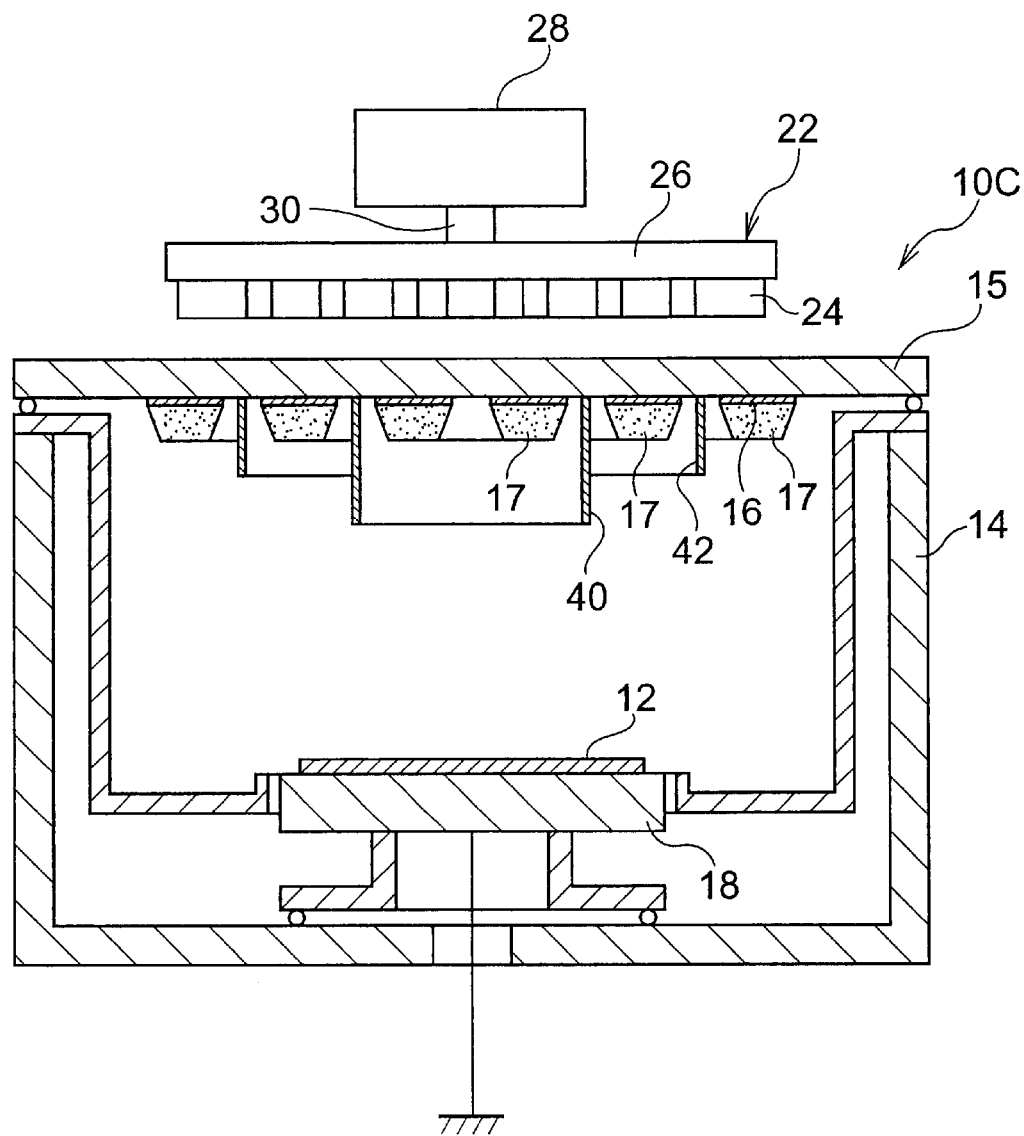
FIG. 7 is a schematic, cross-sectional view to show the third embodiment of the sputtering apparatus according to the present invention.

FIG. 7 is a schematic, cross-sectional view to show still another embodiment of the invention. In FIG. 7, the sputtering apparatus 10C has the structure basically similar to that of the sputtering apparatus 10A illustrated in FIG. 1, but is different therefrom in that cylindrical shield rings 40, 42 are provided between the inside and middle targets and between the middle and outside targets. The electric system applied to each target 17 is similar to that of FIG. 3. When such shield rings 40, 42 are provided, the plasma can be confined in the spaces surrounded by the shield rings 40, 42 and it thus becomes feasible to perform accurate, independent adjustment of the sputtering yields of the targets. Thus in-plane uniformity of deposition is enhanced. Since the shield rings restrain horizontal flight of the target particles, the vertical component becomes dominant in the directions of flight of the target particles, which increases the bottom coverage.

Figure 8:
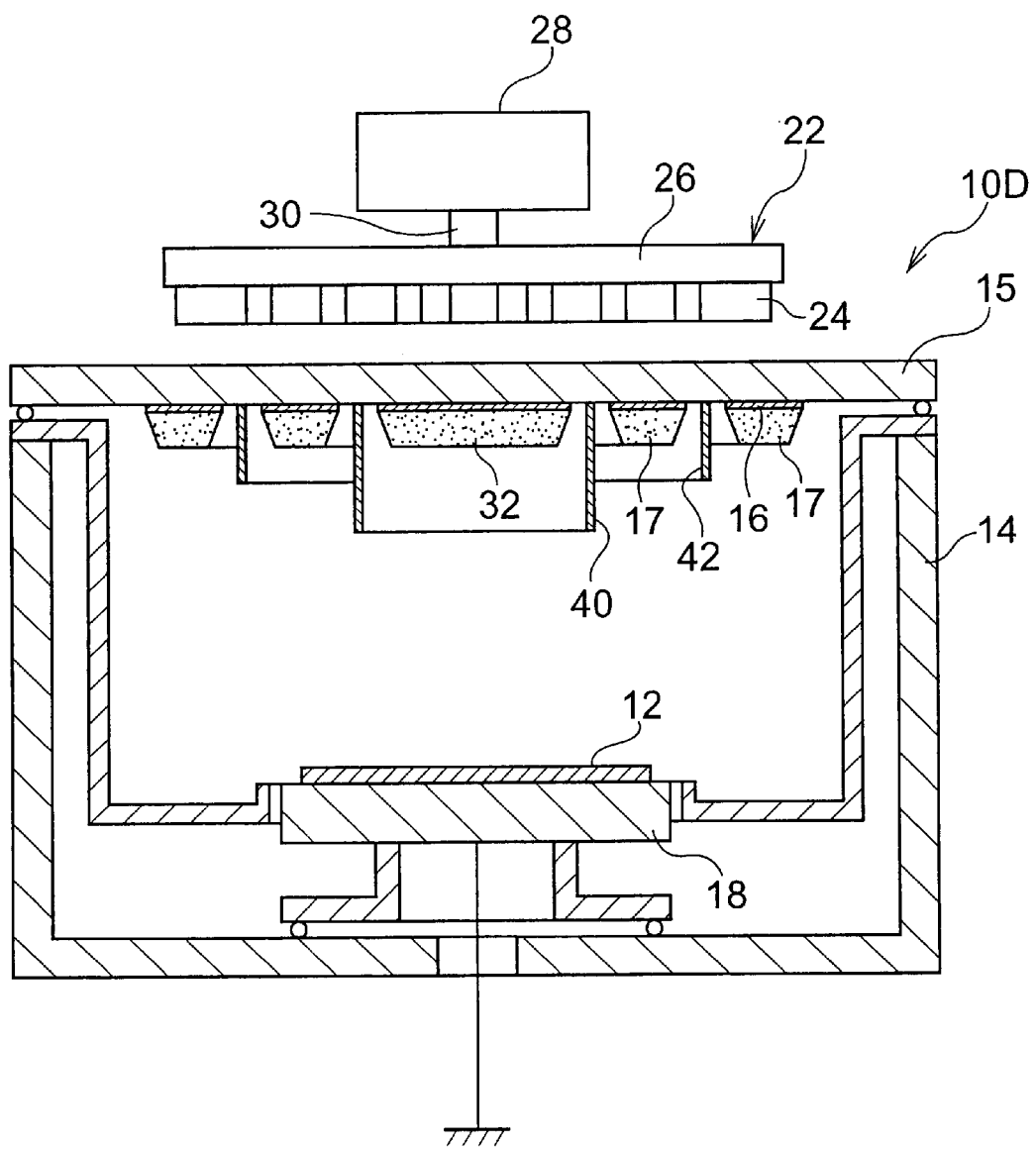
FIG. 8 is a schematic, cross-sectional view to show the fourth embodiment of the sputtering apparatus according to the present invention.

FIG. 8 is a schematic, cross-sectional view to show the fourth embodiment of the sputtering apparatus according to the present invention. In FIG. 8, the sputtering apparatus 10D has the structure basically similar to that of the sputtering apparatus 10B illustrated in FIG. 4, but is different therefrom in that the shield rings 40, 42 are provided around the disklike target 32 and around the target 17. The wiring illustrated in FIG. 6 can also be applied similarly. The advantage from the provision of such shield rings 40, 42 and the advantage from the disklike target are the same as described above.

Figure 9:
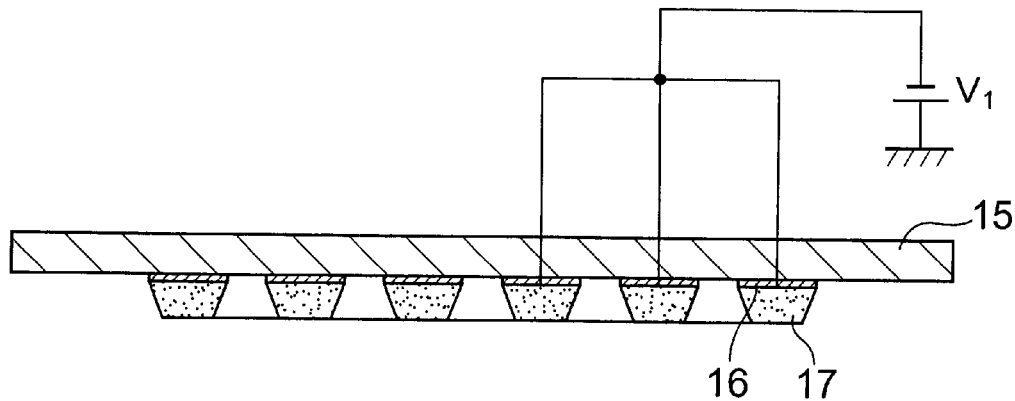
FIG. 9 is a schematic diagram to show a modification of the electric wiring system to the targets.
Figure 10:
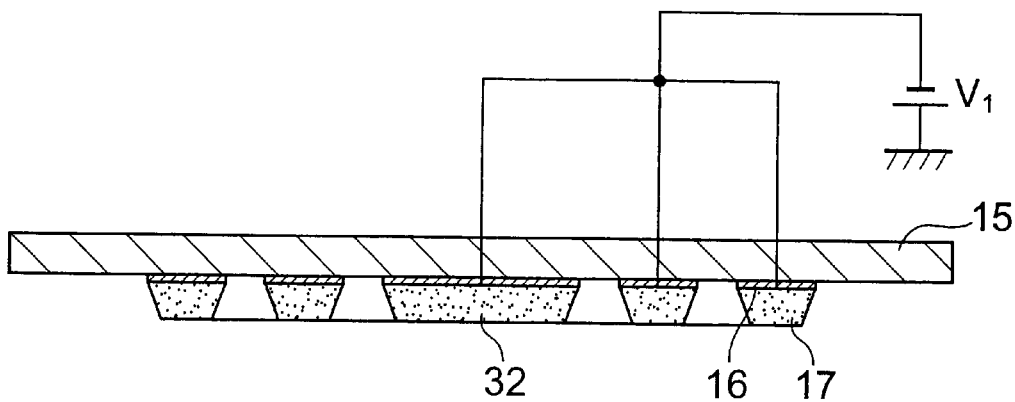
FIG. 10 is a schematic diagram to show another modification of the electric wiring system to the targets.

In the above embodiments, the sputtering apparatus 10A, 10C were described as to the configuration of the dc voltage applied by the wiring illustrated in FIG. 3, and the sputtering apparatus 10B, 10D as to the configuration of the dc voltage applied by the wiring illustrated in FIG. 6. It is, however, noted that the dc voltage may also be applied to the sputtering apparatus 10A, 10C by the wiring illustrated in FIG. 9 and that the dc voltage may also be applied to the sputtering apparatus 10B, 10D by the wiring illustrated in FIG. 10. All the targets are kept at the same potential in these wiring configurations illustrated in FIG. 9 and FIG. 10, but the apparatus can be constructed to prevent the non-uniform erosion of the targets and improve the uniformity of deposition in the semiconductor wafer surface by giving some consideration to the arrangement, magnetic force, etc. of the magnets of the magnetron.

The sputtering apparatus 10A, 10C were described as to the configuration using three ringlike targets 17, but the present invention is not limited only to this example but also permits use of two or four or more ringlike targets. Further, the sputtering apparatus 10C, 10D were described as to the configuration using the two shield rings 40, 42, but the present invention is not limited only to this example but also permits change in the number of targets and change in the number of shield rings according to the process conditions of the sputtering apparatus as occasion may demand.

Further, the above embodiments involve the premise of electroconductive targets, but the present invention can also be applied to targets of electrically insulating materials. In this case, the voltage is applied only to the back plate 16 of each target.

INDUSTRIAL APPLICABILITY

As described above, the present invention permits independent control of erosion of each target, so as to improve in-plane uniformity of film thickness, because the apparatus is provided with the plurality of concentric targets placed opposite the substrate in the process chamber and the means for adjusting the sputtering yield of each divisional target.

The present invention also contributes to increase in the bottom coverage by provision of the shield rings between the divisional targets.

As described above, the sputtering apparatus according to the present invention is advantageous in the fabrication of semiconductor devices and the like recently accelerating toward finer pattern and toward higher precision.

What is claimed is:

1. A sputtering apparatus comprising:

a process chamber;

a holding means for holding a substrate, which is located in said process chamber;

a pressure reducing means for reducing a pressure in said process chamber to a predetermined pressure;

a gas supplying means for supplying a process gas into said process chamber;

a plasma forming means for changing the process gas supplied from said gas supplying means, into plasma;

a plurality of targets of a deposition material placed opposite the substrate held by said holding means and placed on a concentric basis with each other;

a means for adjusting a sputtering yield of each of said targets;

a plurality of cylindrical shield rings, each cylindrical shield ring being disposed between adjacent targets so as to extend substantially perpendicularly from said electrically insulating support;

a magnetron device placed entirely behind said plurality of targets and disposed behind said electrically insulating support; and an electrically insulating support disposed on a side of said process chamber opposite said holding means, said electrically insulating support bearing said targets on a process chamber side of said insulating support, wherein a height of each of said plurality of cylindrical shield rings relative to said electrically insulating support is different from a height of the remaining plurality of cylindrical shield rings relative to said electrically insulating support.

2. The sputtering apparatus according to claim 1, wherein said targets all are of a ring shape.

3. The sputtering apparatus according to claim 1, wherein a target placed innermostly is of a disk shape and at least one target placed outside said disk target is of a ring shape.

4. The sputtering apparatus according to claim 1, wherein a height of said cylindrical shield rings relative to said electrically insulating support increases toward a center of said concentric targets.

5. The sputtering apparatus according to claim 1, wherein said means for adjusting the sputtering yield is magnets of said magnetron device associated with said respective targets.

6. The sputtering apparatus according to claim 1, wherein said means for adjusting the sputtering yield is power supplies connected to said respective targets.

7. The sputtering apparatus according to claim 6, wherein output voltages from said power supplies are different from each other.

8. The sputtering apparatus according to claim 1, further comprising electroconductive back plates for supporting said respective targets, wherein said means for adjusting the sputtering yield is power supplies connected to said respective back plates.

9. The sputtering apparatus according to claim 8, wherein output voltages from said power supplies are different from each other.

* * * * *

UNITED STATES PATENT AND TRADEMARK OFFICE
CERTIFICATE OF CORRECTION

PATENT NO.    : 6,506,290 B1                                                Page 1 of 1
DATED         : January 14, 2003
INVENTOR(S)   : Masanori Ono It is certified that error appears in the above-identified patent and that said Letters Patent is hereby corrected as shown below:

<u>Column 4,</u>
Line 14, please delete "god".

Signed and Sealed this

Ninth Day of September, 2003

JAMES E. ROGAN
*Director of the United States Patent and Trademark Office*